(12) United States Patent
Zur

(10) Patent No.: US 11,525,791 B1
(45) Date of Patent: Dec. 13, 2022

(54) SNR FOR X-RAY DETECTORS IN SEM SYSTEMS BY USING POLARIZATION FILTER

(71) Applicant: Applied Materials Israel Ltd., Rehovot (IL)

(72) Inventor: Yehuda Zur, Tel-Aviv (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 17/347,441

(22) Filed: Jun. 14, 2021

(51) Int. Cl.
*G01N 23/2252* (2018.01)
*H01J 37/04* (2006.01)
*G01N 23/2209* (2018.01)

(52) U.S. Cl.
CPC ..... *G01N 23/2252* (2013.01); *G01N 23/2209* (2018.02); *H01J 37/04* (2013.01); *G01N 2223/079* (2013.01); *H01J 2237/2445* (2013.01)

(58) Field of Classification Search
CPC ........... G01N 23/2252; G01N 23/2209; G01N 2223/079; H01J 37/04; H01J 2237/2445
USPC ......................................... 250/310, 306, 307
See application file for complete search history.

(56) References Cited

U.S. PATENT DOCUMENTS

| 6,670,610 | B2 | 12/2003 | Shemesh et al. | |
| 8,709,269 | B2 | 4/2014 | Shemesh | |
| 2010/0148064 | A1* | 6/2010 | Harrach | H01J 37/28 250/370.15 |
| 2014/0183357 | A1 | 7/2014 | Smith et al. | |
| 2015/0255247 | A1* | 9/2015 | Murakami | H01J 37/28 250/307 |
| 2017/0082425 | A1 | 3/2017 | Minekawa et al. | |
| 2019/0088444 | A1 | 3/2019 | Attal et al. | |
| 2020/0249288 | A1 | 8/2020 | Inami et al. | |

FOREIGN PATENT DOCUMENTS

EP          2417618 B1      3/2013

OTHER PUBLICATIONS

PCT/US2022/025998, "International Search Report and Written Opinion", dated Aug. 10, 2022, 10 pages.

(Continued)

*Primary Examiner* — Kiet T Nguyen
(74) *Attorney, Agent, or Firm* — Kilpatrick Townsend & Stockton LLP

(57) ABSTRACT

A method of performing x-ray spectroscopy surface material analysis of a region of interest of a sample with an evaluation system that includes a scanning electron microscope (SEM) column, an x-ray detector and an x-ray polarizer, comprising: positioning a sample within a field of view of the scanning electron microscope; generating an electron beam having a landing energy about equal to an ionization energy of the materials within the region of interest of the sample; scanning the region of interest with the electron beam set to collide with the sample thereby generating x-rays emitted from near a surface of the sample, the x-rays including characteristic x-rays and Bremsstrahlung radiation; and detecting x-rays generated while the region of interest is scanned by the electron after the x-rays pass through the x-ray polarizer that blocks a higher percentage of the Bremsstrahlung radiation than the characteristic x-rays.

20 Claims, 7 Drawing Sheets

(56) References Cited

OTHER PUBLICATIONS

Champion, et al., "Utilization of Increased Sensitivity of X-Ray Fluorescence Spectrometry due to Polarization of the Background Radiation", Nature, vol. 199, Sep. 14, 1963, 1 page.
Cole, et al., "X-Ray Polarizer", Journal of Applied Physics, vol. 32, No. 10, Oct. 1961, 5 pages.
James, "The Optical Principles of the Diffraction of X-Rays", The Crystalline State—vol. II, 1954, 1-671.
Kirkpatrick, et al., "Theoretical Continuous X-Ray Energy and Polarization", Physical Review, vol. 67, No. 11 and 12, Jun. 1, 1945, 19 pages.

\* cited by examiner

SNR FOR X-RAY DETECTORS IN SEM SYSTEMS BY USING POLARIZATION FILTER

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen of an electronic structure such as a silicon wafer can be analyzed in a scanning electron microscope (SEM) to study a specific characteristic feature in the wafer. Such a characteristic feature may include the circuit fabricated and any defects formed during the fabrication process. An electron microscope is one of the most useful pieces of equipment for analyzing the microscopic structure of semiconductor devices.

When examining a specimen with an electron beam from an SEM tool, x-rays are generated as a result of the irradiation when the electrons impact the surface of the specimen. The x-rays can be analyzed using analytical energy dispersive x-ray spectroscopy (EDX) or wavelength-dispersive x-ray spectroscopy (WDX) techniques to provide quantitative information about the elemental composition of the sample. The x-ray photons can also project an image of the actual pattern morphology at the specimen surface, which can be used to characterize various aspects such as elemental composition, physical dimensions (CD), local or global variation from a simulated architecture (defectivity), the physical location of a pattern relative to other parts of the physical architecture (overlay).

While x-ray imaging processes can be successfully used in evaluating and analyzing samples in many different circumstances and for many different requirements, improvements in x-ray imaging are continuously being sought.

BRIEF SUMMARY OF THE INVENTION

Embodiments of the disclosure enable high resolution material analysis and high-resolution 2D images of a sample surface to be generated using x-ray spectroscopy techniques.

In some embodiments a method of performing x-ray spectroscopy surface material analysis of a region of interest of a sample with an evaluation system that includes a scanning electron microscope (SEM) column, an x-ray detector and an x-ray polarizer is provided. The method can include: positioning a sample within a field of view of the scanning electron microscope; generating an electron beam having a landing energy about equal to an ionization energy of the materials within the region of interest of the sample; scanning the region of interest with the electron beam set to collide with the sample thereby generating x-rays emitted from near a surface of the sample, the x-rays including characteristic x-rays and Bremsstrahlung radiation; and detecting x-rays generated while the region of interest is scanned by the electron after the x-rays pass through the x-ray polarizer that blocks a higher percentage of the Bremsstrahlung radiation than the characteristic x-rays.

Various implementations of the embodiments described herein can include one or more of the following features. Generating a two-dimensional image of the scanned region of interest based on the detected x-rays. The x-rays can be detected by a detector positioned at a 90 degree angle with respect to the electron beam. The SEM column and x-ray detector can be positioned on opposite sides of the region of interest during the scanning and detecting steps. The electron beam can be scanned across the region of interest at a 45 degree angle with respect to the surface of the sample and the detector can be positioned at a 45 degree angle with respect to the surface of the sample. The x-ray polarizer is a separate element disposed between the x-ray detector and the sample. The x-ray detector can be a WDS detector and the x-ray polarizer can be implemented by selecting a specific orientation of a crystal within the WDS detector with respect to the sample.

Some embodiments pertain to a non-transitory computer-readable medium that stores instructions for performing x-ray spectroscopy surface material analysis of a region of a sample according to any of the methods above or herein. For example, by: positioning a sample within a field of view of the scanning electron microscope; generating an electron beam having a landing energy about equal to an ionization energy of the materials within the region of interest of the sample; scanning the region of interest with the electron beam set to collide with the sample thereby generating x-rays emitted from near a surface of the sample, the x-rays including characteristic x-rays and Bremsstrahlung radiation; and detecting x-rays generated while the region of interest is scanned by the electron after the x-rays pass through the x-ray polarizer that blocks a higher percentage of the Bremsstrahlung radiation than the characteristic x-rays.

Some embodiments pertain to a system for performing x-ray spectroscopy surface material analysis of a region of a sample according to any of the methods set forth above or herein. For example, the system can include: a vacuum chamber; a sample support configured to hold a sample within the vacuum chamber during a sample evaluation process; a scanning electron microscope (SEM) column configured to direct a charged particle beam into the vacuum chamber toward the sample; a detector configured to detect x-rays generated from the collision between the charged particle beam and the sample; and a processor and a memory coupled to the processor. The memory can include a plurality of computer-readable instructions that, when executed by the processor, cause the system to: position a sample within a field of view of the scanning electron microscope; generate an electron beam having a landing energy about equal to an ionization energy of the materials within the region of interest of the sample; scan the region of interest with the electron beam set to collide with the sample thereby generating x-rays emitted from near a surface of the sample, the x-rays including characteristic x-rays and Bremsstrahlung radiation; and detect x-rays generated while the region of interest is scanned by the electron after the x-rays pass through the x-ray polarizer that blocks a higher percentage of the Bremsstrahlung radiation than the characteristic x-rays.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure enable high resolution material analysis and high-resolution 2D images of a sample surface to be generated using x-ray spectroscopy techniques. As discussed below, the inventors recognized that Bremsstrahlung radiation is highly polarized in some instances while the characteristic x-ray signal of a sample is not polarized. Embodiments advantageously use the different polarization attributes of the Bremsstrahlung radiation and characteristic x-ray radiation to maintain an acceptable signal-to-noise ratio in an x-ray imaging process even when relatively low landing energies are employed. For example, in some embodiments, a polarization filter can be used to lower the intensity of the Bremsstrahlung radiation signal compared to the characteristic signal, thereby increasing the signal-to-noise ratio and enabling faster and more reliable measurements during an x-ray imaging process.

Example Sample Evaluation Tool

Figure 1:
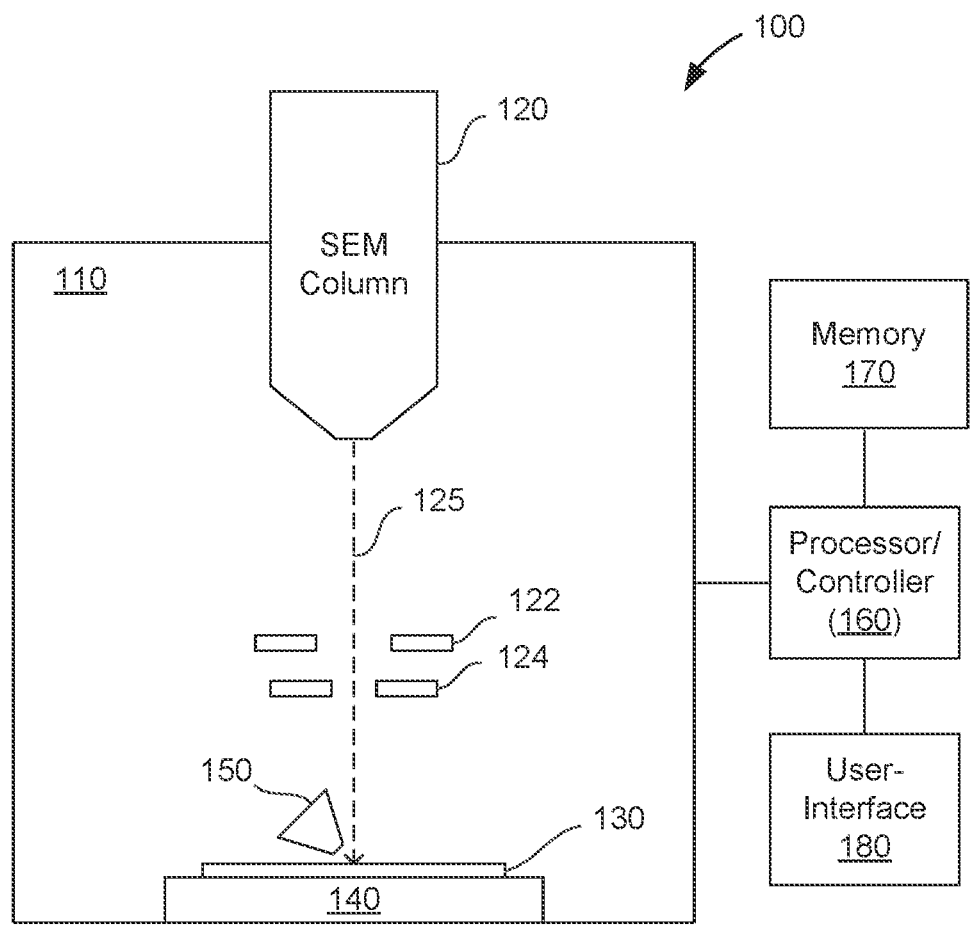
FIG. 1 is simplified illustration of a sample evaluation system according to some embodiments of the disclosure.

In order to better understand and appreciate the disclosure, reference is first made to FIG. 1, which is a simplified schematic illustration of a sample evaluation system 100 according to some embodiments of the disclosure. Sample evaluation system 100 can be used for, among other operations, defect review and analysis of structures formed on samples, such as semiconductor wafers.

System 100 can include a vacuum chamber 110 along with a scanning electron microscope (SEM) column 120. A supporting element 140 can support a sample 130 (e.g., a semiconductor wafer) within chamber 110 during a processing operation in which the sample 130 (sometimes referred to herein as an "object" or a "specimen") is subject to a charged particle beam 125 from the SEM column.

SEM column 120 is connected to vacuum chamber 110 so that charged particle beam 125 generated by the column propagates through a vacuumed environment formed within vacuum chamber 110 before impinging on sample 130. SEM column 120 can generate an image of a portion of sample 130 by illuminating the sample with a charged particle beam, detecting particles emitted due to the illumination and generating charged particle images based on the detected particles. FIG. 1 depicts SEM column 120 generating a charged particle beam 125 that is generally orthogonal to sample 130 when the beam collides with the sample. In various embodiments discussed below, SEM column 120 can be operated in a tilted mode where charged particle beam 125 collides with sample 130 at a non-vertical angle, such as a 45 degree angle.

In both regular and tilted modes, the particle imaging process typically includes scanning a charged particle beam back-and-forth (e.g., in a raster or other scan pattern) across a particular area of the sample being imaged. One or more lenses 122, 124 coupled to the charged particle column can implement the scan pattern as is known to those of skill in the art. Towards this end, in some embodiments lenses 122, 124 can be deflecting lenses, such as magnetic lenses, electrostatic lenses or a combination of both electrical and magnetic lenses.

The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

System 100 can also include an energy dispersive x-ray spectroscopy (EDX) detector 150 that can be used to determine a composition of one or more microscopic elements in a region of interest (ROI) at the surface of sample 130. EDX detector 150 collects x-ray photons emitted as a result of an illumination of the elements by charged particle beam 125. The EDX detector 150 can include an energy analyzer for determining the energy of photons that are detected by the detector, which in turn can enable system 100 to characterize the element from which an x-ray photon was emitted. As non-limiting examples, EDX detector 150 can collect information to generate x-ray spectroscopy graphs of a sample, such as those shown in FIGS. 2 and 4A and 4B below.

One or more controllers 160, such as a processor or other hardware unit, can control the operation of system 100 by executing computer instructions stored in one or more computer-readable memories 170 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

System 100 can further include a user interface 180 that can enable one or more users to interact with the system. For example, user interface 180 can allow a user to set parameters of the SEM column or EDX detector that can be used when analyzing a sample. The user interface 180 can include any known device or devices that enable a user to input information to interact with a computer system such as a keyboard, a mouse, a monitor, a touch screen, a touch pad, a voice activated input controller and the like.

X-Ray Spectroscopy Challenges

Figure 2:
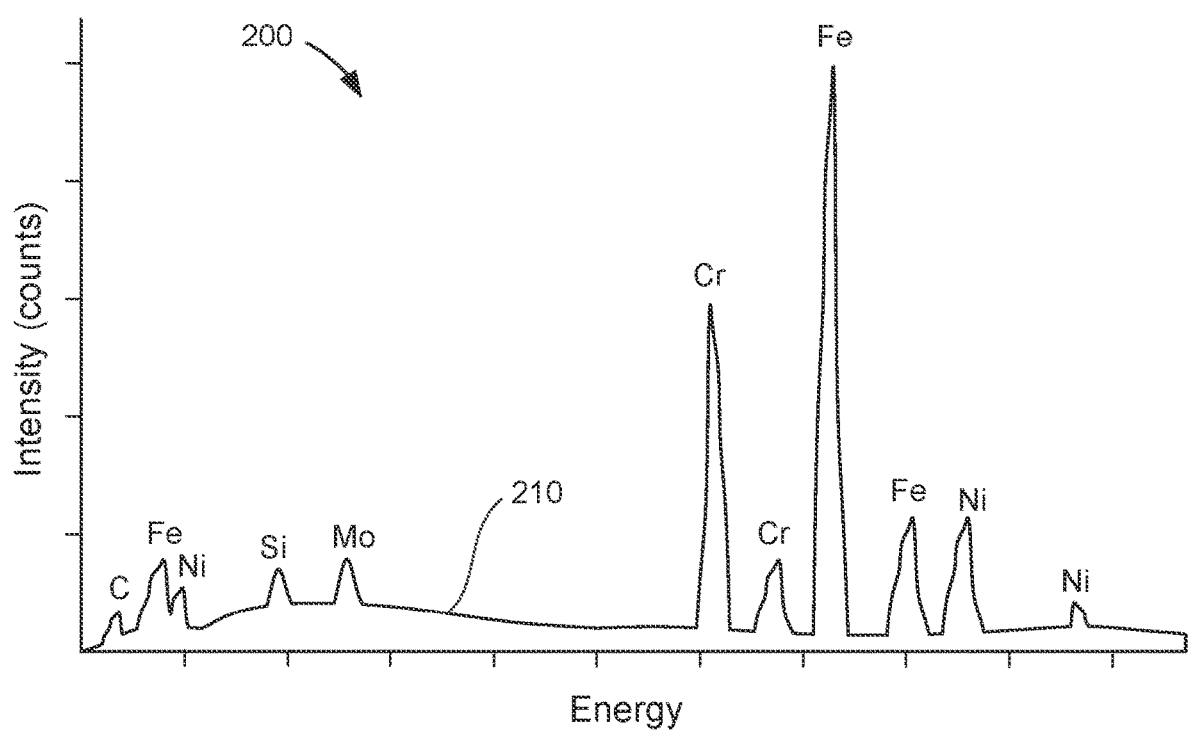
FIG. 2 is an example of an energy-dispersive x-ray spectroscopy graph of a sample material that includes background Bremsstrahlung radiation.

FIG. 2 is an example of an energy-dispersive x-ray spectroscopy graph 200 of a sample material that can be generated by system 100. When a solid target is bombarded by an electron beam, there are two main mechanisms of x-ray emissions that can be detected by EDX detector 150 of system 100: characteristic x-rays and Bremsstrahlung radiation. Characteristic x-rays represent x-ray beams emitted after an inner shell ionization of an atom in the sample material by the bombarded electron followed by an outer shell electron filling the now empty inner shell. Characteristic x-rays have specific energies characteristic to the sample material where the specific energy is equal to the energy difference between the two shells the electron "jumped" between. As an example, the various intensity peaks at different energy levels shown in graph 200 are indicative of different elements within the sample being analyzed and demonstrate that the sample includes at least iron (Fe), carbon (C), chromium (Cr), molybdenum (Mo), nickel (Ni) and silicon (Si).

Also depicted in graph 200 is a certain amount of background radiation 210 that is known as Bremsstrahlung radiation. In short, in addition to the characteristic x-rays, x-ray beams are emitted from a sample in random energies when the bombarding electrons are decelerated by the material nuclei. These random energies can also be detected by EDX detector 150 as the x-ray continuum, which represents a background signal with respect to the characteristic x-rays.

The strength of electron beam used during an x-ray imaging process has a direct impact on both a strength of the x-ray signal generated during the imaging process and the resolution of the imaging process. For example, some x-ray imaging processes use an electron beam that has a landing energy in the range of 5-20 keV. Depending on the sample material, such a landing energy can have an x-ray emission depth of hundreds of nanometers or even microns. As used herein, the x-ray emission depth, which can also be referred to as the "signal production range," is the effective depth from which x-ray photons of certain energy can be emitted by electrons of certain landing energy. Since resolution can only be as good as the signal production range of a single electron, a material analysis of a sample can only produce an image with a resolution on the order of the penetration depth.

Figure 3A:
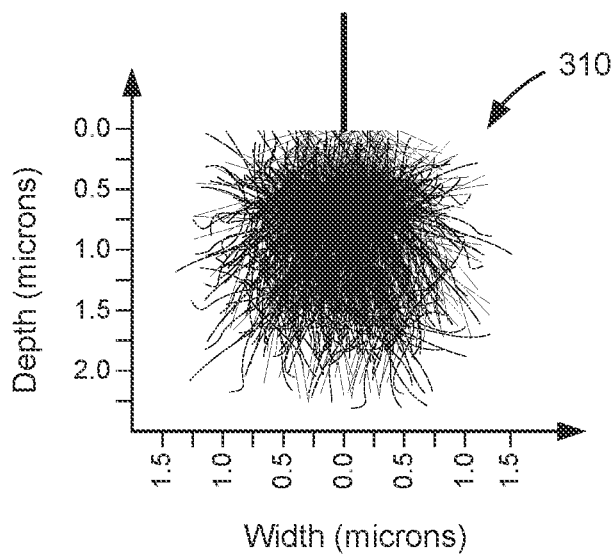
FIGS. 3A-3C are simplified illustrations depicting of the interaction volume of an electron beam in a sample at different landing energies.
Figure 3B:
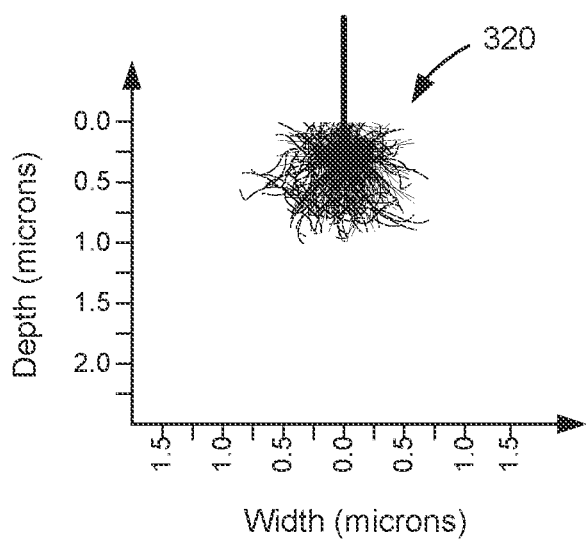
Figure 3C:
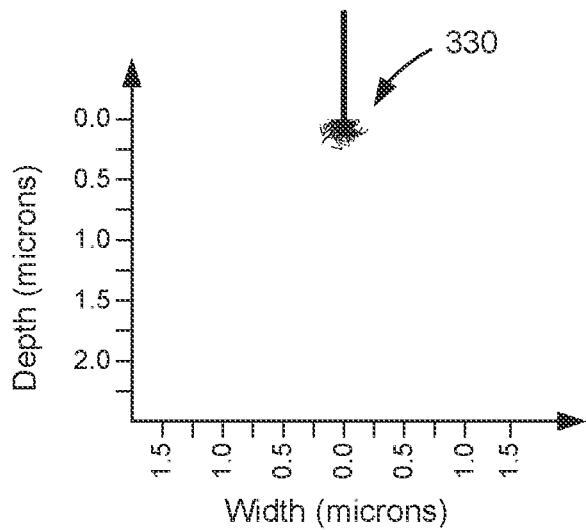

Reference is now made to FIGS. 3A-3C, which are simplified illustrations depicting the penetration depth, which is correlated positively to the x-ray emission depth, and interaction volume of an electron beam in a sample at different landing energies. Specifically, FIG. 3A is a simplified illustration of the interaction volume 310 of an electron beam at a landing energy of 25 kV; FIG. 3B is a simplified illustration of the interaction volume 320 of an electron beam at a landing energy of 15 kV; and FIG. 3C is a simplified illustration of the interaction volume 330 of an electron beam at a landing energy of 5 kV. As evident from a comparison of FIGS. 3A-3C to each other, irradiating a sample with electrons having a landing energy of 25 kV results in a deeper and wider penetration than irradiating the same sample with electrons having a landing energy of 15 kV. Similarly, irradiating a sample with electrons having a landing energy of 15 kV results in a deeper and wider penetration than irradiating the same sample with electrons having a landing energy of 5 kV. Thus, the landing energy used to irradiate a sample (e.g., with electron beam 125) directly impacts the resolution of images generated by system 100 with a lower landing energy directly equating to higher resolution images.

Figure 4A:
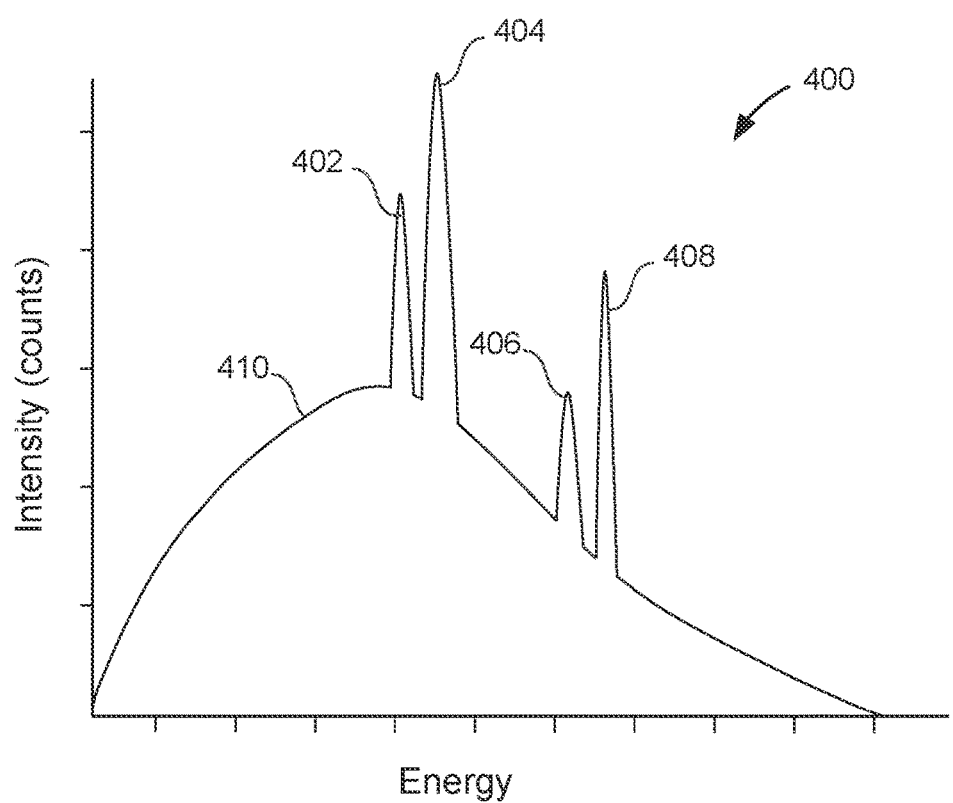
FIGS. 4A and 4B are simplified illustrations depicting a differences in EDX data of a sample exposed to an electron beam at different landing energies.

To achieve the higher resolution x-ray images required in some instances, low landing energies can be required. When using lower landing energies, however, the yield of the x-ray signal degrades dramatically with the characteristic x-ray signal degrading faster than the Bremsstrahlung signal. To illustrate, reference is now made to FIGS. 4A and 4B, which are simplified illustrations depicting a differences in EDX data of a sample exposed to an electron beam at different landing energies. Specifically, FIG. 4A is a simplified illustration of an EDX graph 400 that depicts characteristic x-rays 402, 404, 406 and 408 along with Bremsstrahlung radiation 410. In graph 400 the sample was bombarded with an electron beam having a relatively high landing energy. As can be seen in graph 400, the intensity of the characteristic x-rays 402-408 is significantly higher than the intensity of Bremsstrahlung radiation 410. Thus, characteristic x-rays 402-408 are relatively easy to detect.

Figure 4B:
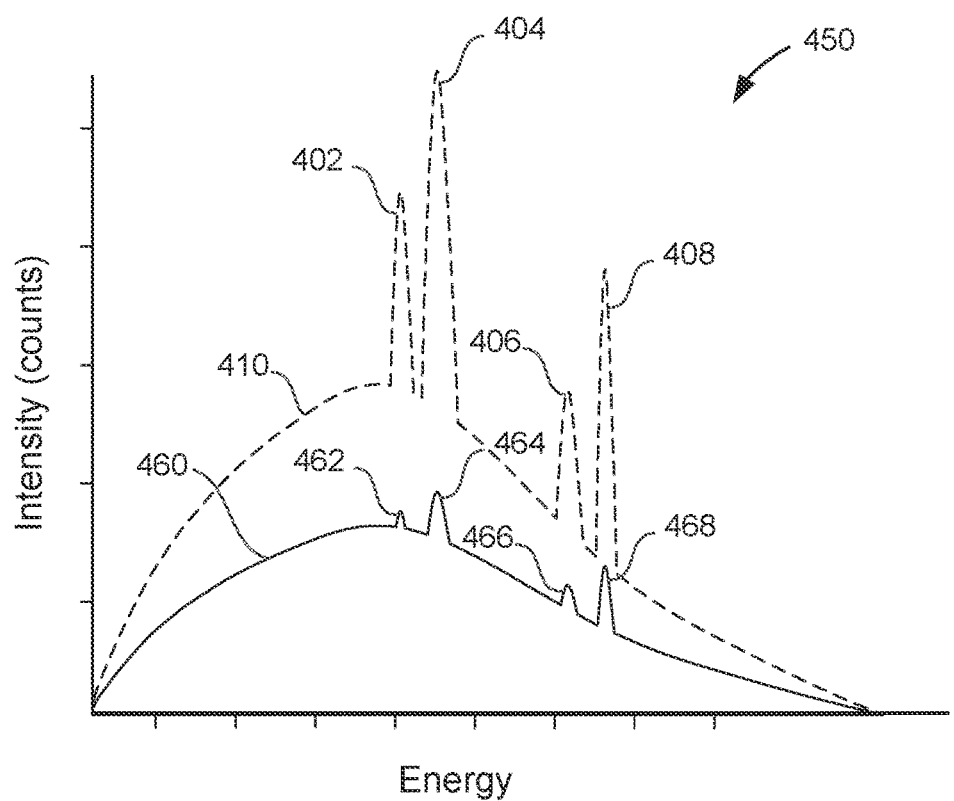

FIG. 4B is a simplified illustration of a second EDX graph 450 that depicts characteristic x-rays 462, 464, 466 and 468 along with Bremsstrahlung radiation 460 superimposed over graph 400. In graph 450 the sample was bombarded with an electron beam having a relatively low landing energy. As can be seen in graph 450, while the intensity of the characteristic x-rays 462-468 is still higher than the intensity of Bremsstrahlung radiation 460, the intensity of the characteristic x-rays relative to the intensity of the Bremsstrahlung radiation has changed dramatically. That is, the ratio between the intensity of the characteristic x-rays and the Bremsstrahlung radiation has decreased significantly making characteristic x-rays 462-468 more difficult to detect. As can be appreciated by a person of skill in the art, if the same sample that was bombarded by an electron beam to produce the graphs in FIGS. 4A and 4B were bombarded by an electron beam with a landing energy significantly lower than that of FIG. 4B, a point can be reached where the characteristic x-rays cannot be accurately detected over the Bremsstrahlung radiation.

Lowering the Bremsstrahlung Radiation with a Polarization Filter

The inventors have developed an approach that enables x-ray imaging with an SEM tool using a lower landing energy electron beam (and thus enabling higher resolution x-ray images) while generating an x-ray signal that has improved signal-to-background ratio. X-rays and other forms of electromagnetic radiation are composed of an electric field and a magnetic field that oscillate in orthogonal directions, each of which are orthogonal to the direction of the radiation propagation. In some instances, electromagnetic radiation can be linearly polarized, which means the direction of the oscillating electric field of the individual photons is constant rather than random. Characteristic x-rays are always random and thus are not linearly polarized. Bremsstrahlung radiation, however, can be linearly polarized when a sample is exposed to an electron beam and x-rays are emitted from the sample. The Bremsstrahlung radiation is emitted in all directions but the polarization strength is highest at 90 degrees to the incident electron beam.

Figure 5:
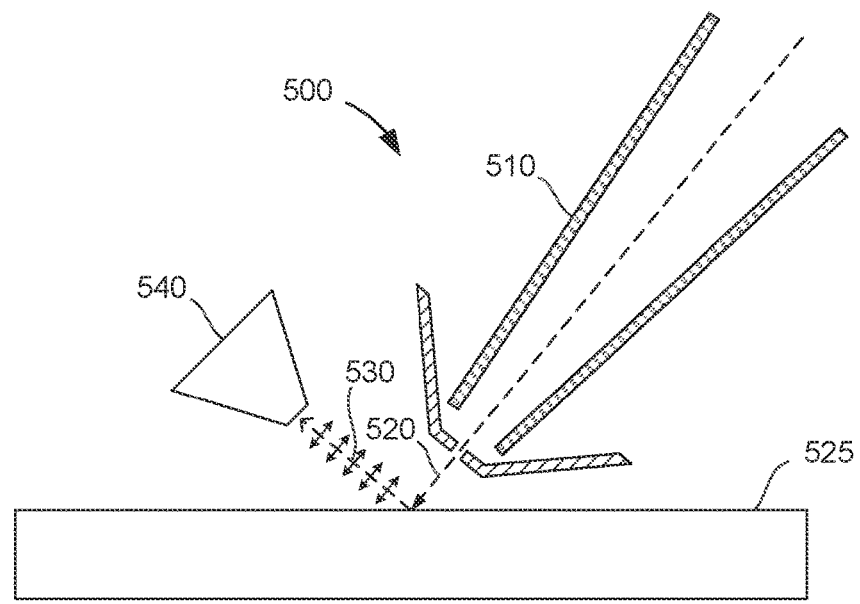
FIG. 5 is a simplified view of an evaluation tool with an SEM column operated in tilted mode at a 45 degree angle with respect to the sample.

FIG. 5, which is a simplified view of an evaluation tool 500, depicts an electron beam 520 generated from an SEM column 510 operated in tilted mode at a 45 degree angle with respect to the sample. SEM column 510 can be representative of SEM column 120 discussed above with respect to FIG. 1. As shown in FIG. 5, when electron beam 520 collides with a sample 525, an x-ray beam 530 of Bremsstrahlung radiation is emitted from near the surface. For ease of illustration, FIG. 5 depicts the highest polarization strength where x-ray beam 530 is emitted from the sample at a 90 degree angle with respect to the incident electron beam 530. As a result, x-ray beam 530 is almost entirely linearly polarized in the direction of the electron beam as indicated by the double-sided arrows shown in FIG. 5 across and perpendicular to x-ray beam 530.

The x-rays in beam 530 can then can be detected by x-ray detector 540 (e.g., EDX detector 150). It is worth noting that x-ray beam 530 is emitted from near the surface of sample 520 at a 90 degree angle with respect to the incident electron beam 520 since, at the sample surface the bombarding electron beam is in the original direction of a 45 degree angle to the sample. As an electron beam penetrates deeper into a sample, the electrons change direction randomly as they pass through the sample which will result in more random x-ray emissions, which reduces the polarization strength of the x-ray emissions due to the randomness in the original direction of the emitting decelerating electron.

Figure 6:
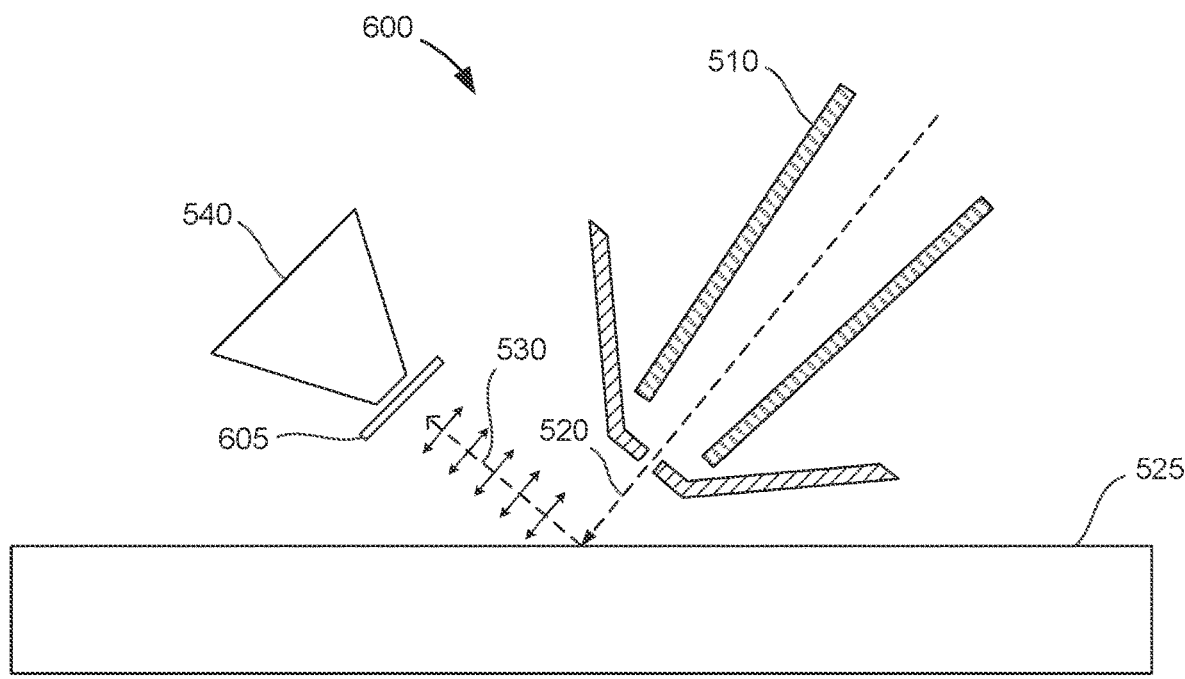
FIG. 6 is a simplified view of an evaluation tool with an SEM column that includes a polarizing filter according to some embodiments.

In some embodiments, a landing energy for the electron beam 530 is selected such that the landing energy is very close to the ionization energy of a material to be detected within the sample. This ensure that a majority of the x-rays will be generated at or very near the surface and thus most of the generated x-rays emitted at a 90 degree angle from the incident electron beam will be linearly polarized. Noting that the characteristic x-rays are random and thus not polarized, in some embodiments an x-ray polarizing filter is placed between the sample and the x-ray detector. For example, FIG. 6 depicts a simplified illustration of an evaluation tool 600. Evaluation tool 600 includes many of the same elements as evaluation tool 500 shown in FIG. 5 and the same reference numbers are used in FIG. 6 as are used in FIG. 5 for like elements.

As shown in FIG. 6, evaluation tool 600 includes an x-ray polarizing filter 605 (sometimes referred to herein as "polarizer 605") disposed in front of x-ray detector 540. Thus, Bremsstrahlung radiation (i.e., x-rays 530) emitted from near an upper surface of sample 525 pass through x-ray polarizing filter 605 before reaching x-ray detector 540. As described above, the Bremsstrahlung radiation emitted from near the sample surface is highly linearly polarized so polarizer 605 will filter out most of the Bremsstrahlung radiation. In contrast, the characteristic x-rays generated from the collision of electron beam 520 with sample 525 are random and not polarized so polarizing filter 605 filters out approximately only half of the characteristic x-rays. In this manner, the signal-to-background (SBR) ratio of the x-ray signal generated by detector 540 in evaluation tool 600 is greatly improved as opposed to that of an evaluation system that does not include polarizer 605.

In some embodiments an x-ray polarizing filter can be implemented based on the physics of Bragg diffraction of x-rays of crystals. In such a design, the x-ray polarizing filter does not alter the x-ray propagation direction and instead only needs to be placed between the sample and the detector as shown in FIG. 6. When a photon is diffracted off a crystal, the diffraction intensity will depend on the photon polarization state. The photon can have polarization in any direction perpendicular to the photon propagation direction. The two extreme polarization states can be defined as: p-polarization, or π-polarization when the photon is polarized parallel to the plane of diffraction; and s-polarization, or σ-polarization when the photon is polarized perpendicular the plane of diffraction and thus photon polarization is also necessarily parallel to the crystal surface plane. The s-polarized photons diffract at a maximum intensity, while different polarizations diffract less according to the angle of polarization and Bragg angle. The p-polarization, which diffracts the least, has a relative intensity as shown in equation (1) below:

$$\frac{I_p}{I_s} = \cos 2\theta \quad (1)$$

The appropriate Bragg θ angle to detect the x-rays can be different for depending on the type of crystal and its crystal atomic-lattice structure employed in the x-ray polarizing filter. In some embodiments, while the sample is exposed to the electron beam and x-rays are detected, the Bragg angle θ can be changed constantly by changing the orientation of the polarizer to detect different electromagnetic wavelengths. For example, in some embodiments the x-ray polarizing filter can include a MEMS or similar actuator to change the orientation of the polarizer.

Wavelength-Dispersive Spectroscopy Detector

In some embodiments, instead of placing a separate x-ray polarizing filter in front of an x-ray detector a wavelength-dispersive spectroscopy (WDS) detector can be used as both x-ray detector 540 and polarizer 605. A wavelength-dispersive spectroscopy detector is based on the physics of Bragg diffraction of x-rays of crystals and thus can have a polarizing filter effect as a side effect of its uses in various instances. Such detectors can have better spectral resolution than EDX detectors, but typically have slower throughput since they detect each wavelength (energy) separately. In operation, the Bragg angle θ is changed constantly to enable the WDS detector to detect different electromagnetic wavelengths. The appropriate θ angle for a given WDS detector is different for each crystal according to the crystal atomic-lattice structure. While the sample is exposed to the electron beam and x-rays are detected, the WDS detector can be used to maximize polarization filtering. For example, the WDS detector can be rotated in an additional direction, perpendicular to that of the wavelength-controlling rotation. This additional direction is a rotation about the axis that is the incident x-ray propagation direction. Combining the rotational directions results in one angle set to control the wavelength detected and a second angle set to control polarization.

Example Method

Figure 7:
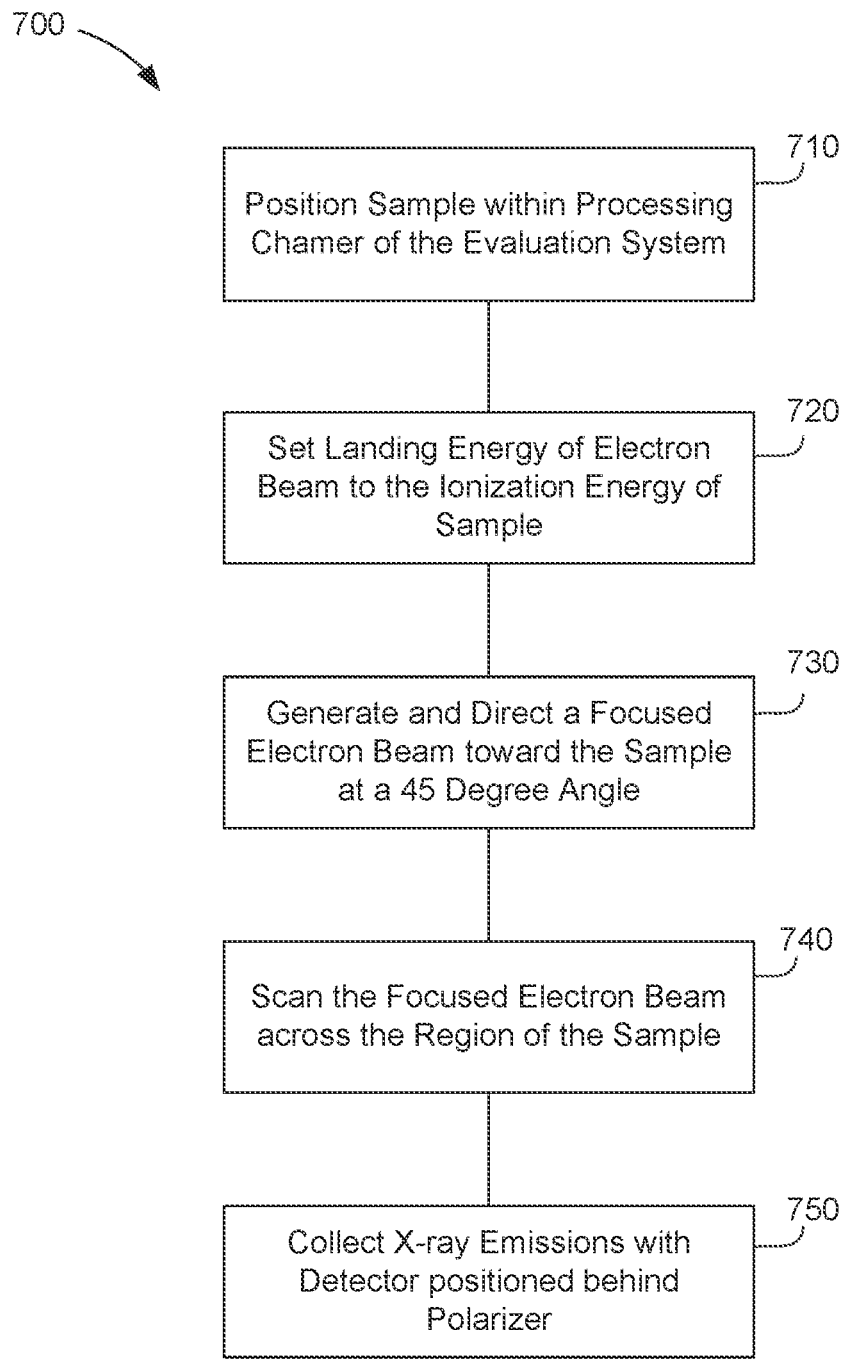
FIG. 7 is a flowchart depicting steps associated with a analyzing a sample according to some embodiments of the disclosure.

Reference is now made to FIG. 7, which is a simplified flowchart depicting various steps associated with a method 700 according to some embodiments. Method 700 can start by positioning a sample having one or more regions or interest (ROI) to be analyzed within an appropriate evaluation tool, such as evaluation system 100 or 600 (block 710). As discussed below with respect to FIG. 8, the ROI can be, for example, an area on a semiconductor wafer. In some instances a user will want to analyze multiple ROI's on a single sample in which case the steps associated with method 700 can be separately performed for each ROI.

Next, a landing energy for the electron beam generated by the evaluation system is set to a level close to the ionization energy of the sample (block 72). To set the landing energy appropriately, it is assumed that the materials within the ROI of the sample are known or can be readily determined in order to know the ionization energy of the sample. For example, in some instances the ionization energy of the ROI can be automatically identified by the evaluation tool based on the location of the ROI and a known mapping of materials and features that have been formed on the sample (e.g., from a simulated architecture of the sample). With the ionization energy known, the evaluation tool can then select an appropriate landing energy for the ROI. In other instances a user can input the landing energy through a user interface (for example, a keyboard, a touch screen, a mouse or other type of pointer device, a voice controlled input device or any other appropriate input device as described above) associated with the evaluation tool. The user can select a specific landing energy in any one of several ways. In some instances, landing energy can be selected by the user can based on the user's past knowledge and/or experience operating the evaluation system on similar samples, can be based on predetermined instructions the user received (e.g., based on a manufacturer's predetermined evaluation process), can be based on calculations performed by the user either at the time of input or previously performed, or can be based on any other appropriate criteria.

Once the appropriate landing energy is determined, the electron beam can be generated (block 730) and scanned across the ROI of the sample (block 740) with the SEM column in tilt mode (e.g., at a 45 degree angle) and x-ray emissions can be collected during the scanning process (block 750). In actual implementation, the steps depicted in blocks 730, 740 and 750 can occur essentially simultaneously and can be extremely fast.

An Example of a Region of Interest

Figure 8:
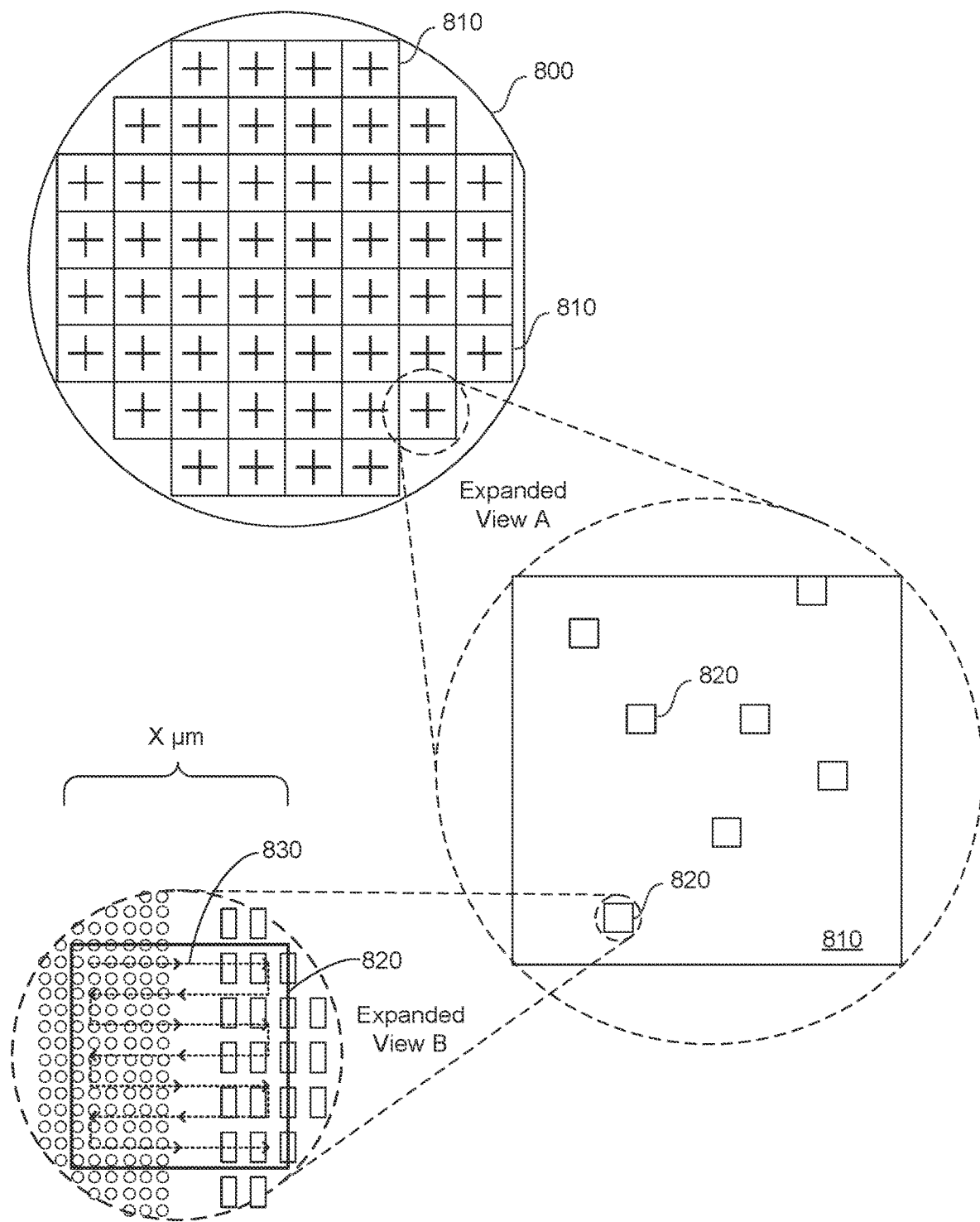
FIG. 8 is a simplified illustration of an area on a semiconductor wafer that can be analyzed according to some embodiments.

To further illustrate an exemplary region of interest (ROI) that can be analyzed in accordance with method 500, reference is made to FIG. 8, which is a simplified illustration of a semiconductor wafer 800. FIG. 8 includes a top view of wafer 800 along with two expanded views of specific portions of wafer 800. Wafer 800 can be, for example, a 200 mm or 300 mm semiconductor wafer and can include multiple integrated circuits 810 (fifty two in the example depicted) formed thereon. The integrated circuits 810 can be at an intermediate stage of fabrication and the x-ray analysis techniques described herein can be used to evaluate and analyze one or more regions of interest (ROI) 820 of the integrated circuits. For example, Expanded View A of FIG. 8 depicts multiple ROIs 820 of one of the integrated circuits 810 that can be evaluated and analyzed according to the techniques described herein. Expanded View B depicts one of those ROIs 820 that includes several different types of structures.

Some embodiments can analyze and evaluate ROI 820 by scanning the region with an electron beam (e.g., generated by system 100 or 600) within ROI 820 according to a raster or other scan pattern, such as scan pattern 830, depicted in simplified format in the Expanded View B of FIG. 8. During the scanning process, x-rays can be collected after being passed through a polarizer to improve the SBR of the x-ray signal and the x-ray signal can then be analyzed to determine the chemical elements present at each location of the scan pattern.

The foregoing description, for purposes of explanation, used specific nomenclature to provide a thorough understanding of the described embodiments. However, it will be apparent to one skilled in the art that the specific details are not required in order to practice the described embodiments. For example, as noted above, the polarization strength of Bremsstrahlung radiation x-rays is highest at 90 degrees. To take maximum advantage of such, example embodiments described above positioned detector 540 at a 90 degree angle with respect to the electron beam. Other embodiments, however, can position the detector at angles other than 90 degrees to the electron beam.

Thus, the foregoing descriptions of the specific embodiments described herein are presented for purposes of illustration and description. They are not intended to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings.

To the extent the illustrated embodiments in the present patent application can, for the most part, be implemented using electronic components and circuits known to those skilled in the art, details of such are not explained in any greater extent than that considered necessary as illustrated above, for the understanding and appreciation of the underlying concepts of the present patent application and in order not to obfuscate or distract from the teachings of the present disclosure.

What is claimed is:

1. A method of performing x-ray spectroscopy surface material analysis of a region of interest of a sample with an evaluation system that includes a scanning electron microscope (SEM) column, an x-ray detector and an x-ray polarizer, the method comprising:
   positioning a sample within a field of view of the scanning electron microscope column;
   generating an electron beam having a landing energy about equal to an ionization energy of the materials within the region of interest of the sample;
   scanning the region of interest with the electron beam set to collide with the sample thereby generating x-rays emitted from near a surface of the sample, the x-rays including characteristic x-rays and Bremsstrahlung radiation; and
   detecting x-rays generated while the region of interest is scanned by the electron beam after the x-rays pass through the x-ray polarizer that blocks a higher percentage of the Bremsstrahlung radiation than the characteristic x-rays.

2. The method set forth in claim 1 further comprising generating a two-dimensional image of the scanned region of interest based on the detected x-rays.

3. The method set forth in claim 1 wherein the x-rays are detected by a detector positioned at a 90 degree angle with respect to the electron beam.

4. The method set forth in claim 3 wherein the SEM column and x-ray detector are positioned on opposite sides of the region of interest during the scanning and detecting steps.

5. The method set forth in claim 4 wherein the electron beam is scanned across the region of interest at a 45 degree angle with respect to the surface of the sample and the detector is positioned at a 45 degree angle with respect to the surface of the sample.

6. The method set forth in claim 1 wherein the x-ray polarizer is a separate element disposed between the x-ray detector and the sample.

7. The method set forth in claim 1 wherein the x-ray detector is a WDS detector and the x-ray polarizer is implemented by selecting a specific orientation of a crystal within the WDS detector with respect to the sample.

8. A non-transitory computer-readable memory that stores a plurality of computer-readable instructions for evaluating a region of a sample by:
   positioning a sample within a field of view of a scanning electron microscope;
   generating an electron beam having a landing energy about equal to an ionization energy of materials within the region of interest of the sample;
   scanning the region of interest with the electron beam set to collide with the sample thereby generating x-rays emitted from near a surface of the sample, the x-rays including characteristic x-rays and Bremsstrahlung radiation; and
   detecting x-rays generated while the region of interest is scanned by the electron beam after the x-rays pass through an x-ray polarizer that blocks a higher percentage of the Bremsstrahlung radiation than the characteristic x-rays.

9. The non-transitory computer-readable memory set forth in claim 8 wherein the computer-readable instructions for evaluating a region of a sample further comprise instructions for generating a two-dimensional image of the scanned region of interest based on the detected x-rays.

10. The non-transitory computer-readable memory set forth in claim 8 wherein the x-rays are detected by a detector positioned at a 90 degree angle with respect to the electron beam.

11. The non-transitory computer-readable memory set forth in claim 8 wherein the electron beam is scanned across the region of interest at a 45 degree angle with respect to the surface of the sample and the detector is positioned at a 45 degree angle with respect to the surface of the sample.

12. The non-transitory computer-readable memory set forth in claim 8 wherein the x-ray polarizer is a separate element disposed between the x-ray detector and the sample.

13. The non-transitory computer-readable memory set forth in claim 8 wherein the x-ray detector is a WDS detector and the x-ray polarizer is implemented by selecting a specific orientation of a crystal within the WDS detector with respect to the sample.

14. A system for evaluating a region of a sample, the system comprising:
  a vacuum chamber;
  a sample support configured to hold a sample within the vacuum chamber during a sample evaluation process;
  a scanning electron microscope (SEM) column configured to direct a charged particle beam into the vacuum chamber toward the sample;
  a detector configured to detect x-rays generated from the collision between the charged particle beam and the sample; and
  a processor and a memory coupled to the processor, the memory including a plurality of computer-readable instructions that, when executed by the processor, cause the system to:
    position a sample within a field of view of the scanning electron microscope column;
    generate an electron beam having a landing energy about equal to an ionization energy of materials within the region of interest of the sample;
    scan the region of interest with the electron beam set to collide with the sample thereby generating x-rays emitted from near a surface of the sample, the x-rays including characteristic x-rays and Bremsstrahlung radiation; and
    detect x-rays generated while the region of interest is scanned by the electron beam after the x-rays pass through an x-ray polarizer that blocks a higher percentage of the Bremsstrahlung radiation than the characteristic x-rays.

15. The system according to claim 14 further comprising computer-readable instructions that, when executed by the processor, cause the system to generate a two-dimensional image of the scanned region of interest based on the detected x-rays.

16. The system according to claim 14 wherein the x-rays are detected by a detector positioned at a 90 degree angle with respect to the electron beam.

17. The system according to claim 16 wherein the SEM column and x-ray detector are positioned on opposite sides of the region of interest during the scanning and detecting steps.

18. The system according to claim 16 wherein, during the scanning process, the electron beam is set at a 45 degree angle with respect to the surface of the sample and the detector is positioned at a 45 degree angle with respect to the surface of the sample.

19. The system according to claim 14 wherein the x-ray polarizer is a separate element disposed between the x-ray detector and the sample.

20. The system according to claim 14 wherein the x-ray detector is a WDS detector and the x-ray polarizer is implemented by selecting a specific orientation of a crystal within the WDS detector with respect to the sample.

\* \* \* \* \*